United States Patent [19]

Morse et al.

[11] Patent Number: 4,684,800
[45] Date of Patent: Aug. 4, 1987

[54] LOW-NOISE CHARGE-INJECTION METHOD AND APPARATUS FOR IR CCD SCANNING

[75] Inventors: Arthur L. Morse, Hawthorne; Niels A. Thompson, Los Angeles, both of Calif.

[73] Assignee: Hughes Aircraft Company, Los Angeles, Calif.

[21] Appl. No.: 839,398

[22] Filed: Mar. 14, 1986

[51] Int. Cl.[4] ........................ H01J 40/14; H01L 29/78
[52] U.S. Cl. ................................... 250/211 J; 357/24
[58] Field of Search ....................... 357/24 LR, 30, 32; 250/211 J, 211 R, 578, 370 G, 338

[56] References Cited

U.S. PATENT DOCUMENTS

| | | | |
|---|---|---|---|
| 4,360,732 | 11/1982 | Chapman et al. | 250/332 |
| 4,369,372 | 1/1983 | Yoshioka et al. | 250/578 |
| 4,394,675 | 4/1983 | Anagnostopoulos et al. | 357/24 |
| 4,472,638 | 9/1984 | Nishizawa et al. | 250/211 J |
| 4,504,740 | 3/1985 | Gillessen et al. | 250/211 J |
| 4,583,108 | 4/1986 | Sirieix | 357/30 |

Primary Examiner—David C. Nelms
Assistant Examiner—William L. Oen
Attorney, Agent, or Firm—Ronald L. Taylor; A. W. Karambelas

[57] ABSTRACT

A method and circuit for reading out the detector signal current from an infrared focal plane array by converting the detector current into a precisely proportional charge packet which is injected into the channel of a charge-coupled device (CCD). In a preferred embodiment the circuit comprises a capacitive feedback transimpedance amplifier 30 (or similar infrared detector signal encoding circuit) coupled to a precision CCD charge-injection circuit 10 formed on a semiconducting substrate 12. A surface potential well 50 underneath a reservoir gate electrode 80 is filled with charge that is initially kept in place by a channel stop 14 and a potential barrier 62. When the detector signal is applied to signal gate electrode 60, the potential barrier 62 is lowered and a precisely proportional amount of charge fills a store potential well 48 underneath a store gate electorde 85. At an appropriate time the charge in the storage potential well 48 is transferred to CCD channel 90 by means of a clock pulse applied to a transfer gate electorde 100.

14 Claims, 10 Drawing Figures

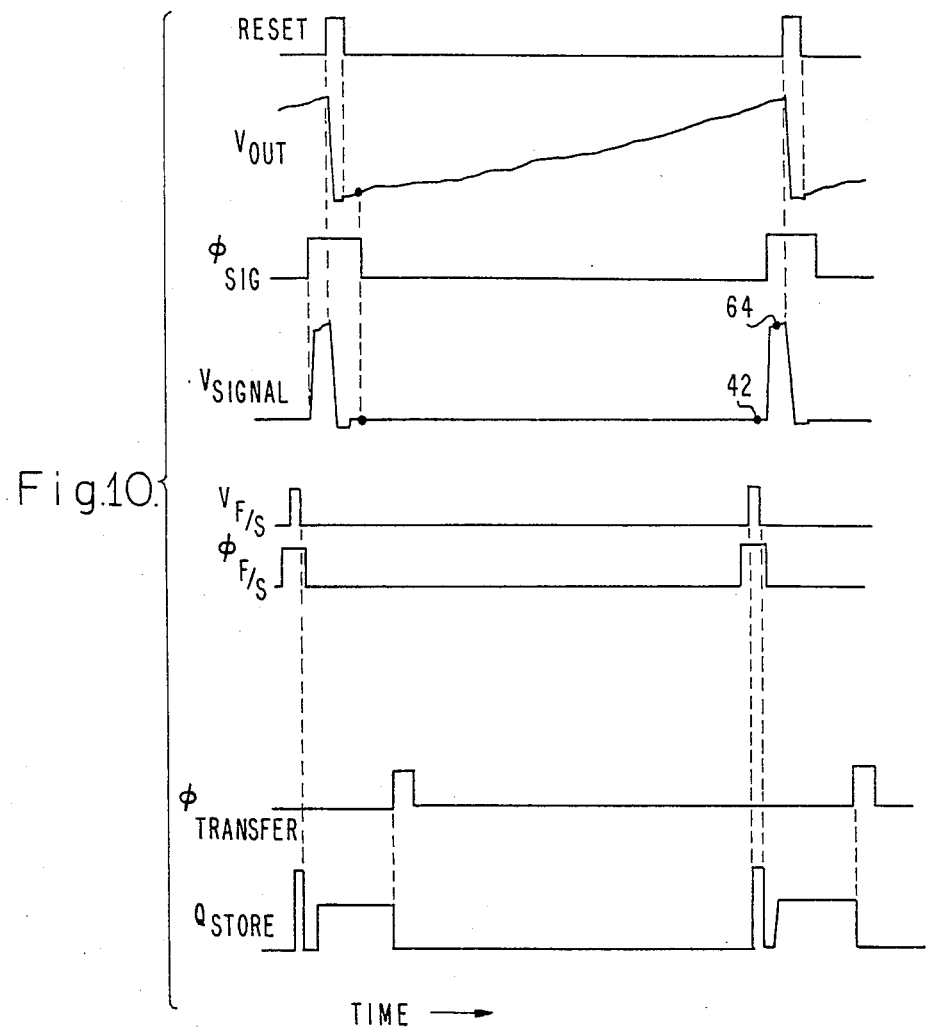

LOW-NOISE CHARGE-INJECTION METHOD AND APPARATUS FOR IR CCD SCANNING

BACKGROUND OF THE INVENTION

1. Field of the Invention

The present invention relates to readout of detector signals from infrared imaging arrays and, in particular, to charge-coupled device utilization in imaging systems.

2. Description of Related Art

Decriptions of various infrared sensing devices, including but not limited to imaging devices formed on semiconducting substrates, can be found in *The Infrared Handbook,* by Wolfe et al., Office of Naval Research, Department of the Navy, 1978, particularly on pages 12–27 through 12–54. Typically, such an IR imaging device comprises an array of detectors whose outputs are converted into signals which are proportional to the amounts of IR radiation received during the integration time, then sent to an array of parallel charge-coupled device (CCD) serial registers. The CCD serial registers receive charge from photodetectors which are adjacent on the substrate. Often the parallel CCD registers are arranged in vertical columns, with their outputs connected to a single horizontal CCD register which acts as the multiplexer.

Once during each CCD clock cycle a small amount of charge, commonly referred to as a "fat zero charge packet," is injected into each column CCD register. This is done to increase charge transfer efficiency. In the ideal case the amount of charge contained in each fat zero chare packet is constant. The column CCD registers are typically connected to a common input gate through which the fat zero charge packet can be separately introduced into each of the column registers.

The signal generated by CCD imagers is affected by several sources of noise. One such source is fast interface state noise (also called "FIS noise" or "surface state noise"); it is described on pages 111 and 112 of the book *Charge Transfer Devices,* by Sequin et al., published by Academic Press, Inc., in 1975 in New York. Interface noise arises out of a phenomenon in which random trapping of CCD charge carriers takes place in crystalline surface states in the interface between the semiconductor substrate surface and the overlying insulating layer. The effect is that the amount of transfered charge fluctuates, and the fluctuations result in FIS noise.

Another source of noise is electrical injection noise, also described in the cited reference by Sequin, on page 116. Electrical injection noise is the result of jitter in the voltages applied to control the operation of the charge-coupled device. The capacity of an electrical potential well in a semiconductor substrate to hold charge varies with the fluctuations of the voltage applied to the gate electrode underneath which the potential well is formed. Electrical injection noise is generated by such fluctuations. Both interface state noise and electrical injection noise are important considerations if the CCD imager views a scene that has a low background radiation level.

In cases where the background radiation level is high, another significant noise source is background photon noise. This topic is treated on pages 11–18, 11–19, and 11–39 through 11–44 of the reference by Wolfe et al. cited above. Background photon noise is caused by fluctuations in the background radiation level, and is proportional to the square root of the number of photons or photon-generated carriers. If the detector gain is reduced to compensate for high levels of background radiation, the number of photon-generated carriers is reduced and the signal-to-noise ratio decreases.

Two critical requirements for space sensor applications are low-noise readout of the detector signals and the ability to perform low-power analog time-delay-and-integration (TDI) on the sensor chip. Low-noise readout circuits must maintain nearly constant detector bias for accurate signal conversion with sensitive narrow-bandgap detector semiconductors such as indium antimonide and mercury cadmium telluride. Focal plane detector arrays currently being designed involve very large numbers of densely packed IR detector elements. The high packing density requires low-power analog signal processing (such as charge-domain TDI) on the chip to reduce spacecraft power consumption for cooling.

Several techniques exist for encoding output from a semiconductor IR detector into charge packet form.

As shown in FIG. 1, the method of direct injection involves filling the potential well under the middle gate electrode designated $\phi_2$ and then clocking the charge into the CCD channel. With direct injection the detector "sees" a high impedance, since the input MOSFET formed by the diffusion and the $V_{BIAS}$ gate is operating in subthreshold. The detector bias therefore varies with signal. Fluctuations of the 1/f type of the surface potential under the $V_{BIAS}$ gate modulates the detector bias, and for low-impedance detectors also modulates the charge passed to the $\phi_2$ well. FIG. 2 shows another technique used for fat zero injection; this technique is subject to random variation in the spilling of charge as the $\phi_1$ gate surface potential is raised to isolate the charge packet in the $\phi_2$ well.

The method of buffered direct injection (also called the synthetic transimpedance amplifier method) is shown in FIG. 3. This method reduces both detector bias variation with signal current and the readout circuit input impedance by a factor of G, the gain of the inverting buffer. However, 1/f noise from the input MOSFET modulates the detector bias and hence the detector current form low-impedance detectors.

The direct injection method is improved on by the Tompsett sampler charge injection circuit, which is shown in FIG. 4. The potential well under the $V_{IN}$ gate is filled and then spilled by pulsing $\phi_{DIFF}$ and $\phi_{GATE}$. The amount of charge left in the well depends on the difference in voltage between $V_{IN}$ and $\phi_{GATE}$. The surface potentials under both $V_{IN}$ and $\phi_{GATE}$ gates give rise to 1/f noise that causes the size of the well to fluctuate. An improved version of the Tompsett sampler charge injection circuit is shown in FIG. 5, embodying a well gate with a much smaller area to reduce the effects of random fluctuations in the surface potential under the gate $V_{IN1}$. A wide gate $V_{IN2}$ is provided to allow full dynamic range for test purposes, as shown in FIG. 6, but would not be used for sensitive infrared detection applications.

None of the above methods of chare injection allows the processing of detector signals having a large dynamic range while operating with low 1/f noise and minimal detector bias variation, as well as also offering the possibility of being used for fat zero charge injection so that fluctuating surface potentials in the metal oxide semiconductor structure present less of a problem. There has long been a need for a method and apparatus for the conversion of a small current from a photodetector into a precisely proportional charge packet and its injection into a CCD channel. Such a method and apparatus would be a boon to the technology of reading out the signals from IR detector arrays, which is so important for critical remote sensing applications.

SUMMARY OF THE INVENTION

The present Hughes invention solves the problem of providing accurate, low-noise conversion of a small current, such as that generated by an IR focal plane detector element, into a precisely proportional charge packet and then injecting it into a CCD channel. In one exemplary embodiment the subject invention comprises a capacitive feedback transimpedance amplifier (CTIA) coupled to a precision CCD charge injection circuit. The conversion of a voltage change to a precisely proportional charge packet is effected by first filling a reservoir potential well with charge and then allowing the signal voltage to lower a surface potential barrier under a signal gate so that the reservoir charge spills into a surface potential storage well. The amount of charge transferred to the storage potential well is precisely proportional to the change in signal voltage level produced by the photodetector amplifier circuit. The time between the filling/spilling of the reservoir well and the lowering of the signal gate potential barrier is made as small as possible while still allowing for complete transfer of charge into the storage potential well, in order to minimize the effect of surface potential fluctuations of the 1/f type on the amount of the charge transferred. The time difference between the filling/spilling of the reservoir well and the application of the signal voltage change to the signal gate electrode is made small compared to the dwell time period of the photodetector. After the signal charge packet is isolated in the storage potential well, it is transferred to the CCD channel by applying a clock pulse to a transfer gate. The charge packet can then be moved along the CCD channel.

Therefore, it is an object of the present invention to accurately convert a small current, such as that generated by an infrared focal plane detector element, into a precisely proportional charge packet and inject it into a CCD channel.

It is a further object of the present invention to provide for precise charge packet injection into a CCD channel in a manner which is improved over the Tompsett sampler circuit.

It is another object of the present invention to operate with reduced 1/f noise compared to the methods commonly known as "direct injection" and "buffered direct injection."

It is yet another object of the present invention in an exemplary embodiment using a CTIA circuit to operate with lower noise and reduced detector bias variation compared with direct injection or buffered direct injection.

It is still another object of the present invention in an exemplary embodiment to use the disclosed method of charge injection to implement precise fat zero charge injection for charge-coupled devices, so that the associated encoding scheme suffers less from fluctuating surface potentials in the metal oxide semiconductor (MOS) structure.

Finally, it is an object of the present invention to allow processing of detector signals having a large dynamic range.

The present invention provides a new method, as well as a circuit based on that method, for accurately converting a small current, such as that generated by a detector element in an IR focal plane array, into a precisely proportional charge packet and injecting it into a CCD channel. Typically such a circuit will furnish the interface between a semiconductor IR detector and the multiplexing electronics for the detector array.

An appreciation of other aims and objects of the present invention and a more complete and comprehensive understanding of this invention may be achieved by studying the following description of a preferred embodiment and by referring to the accompanying drawings.

BRIEF DESCRIPTION OF THE DRAWINGS

FIG. 10 shows the relative timing of the signal pulse and the various clock pulses. The vertical axes represent pulse amplitude and the horizontal axes represent time. Also shown are the charge pulses in the storage well.

DESCRIPTION OF A PREFERRED EMBODIMENT

Figure 1:
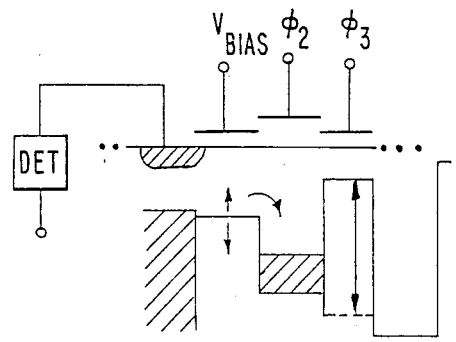
FIG. 1 is a schematic representation of the method of encoding output from a semiconductor infrared detector into charge packet form commonly referred to "direct injection." Beneath the schematic circuit diagram is a potential diagram which illustrates the various surface potential levels in the corresponding regions of the circuit. The crosshatched areas represent charge, and a broken line represents a temporarily changed potential level. Vertical arrows indicate directions of change of a potential level, whereas curved arrows give the directions of flow of charge. Small opposed vertical arrows above and below the line representing a surface potential level indicate fluctuation of that surface potential due primarily to 1/f-type surface noise. The rightmost potential level in the drawing is for a CCD channel.
Figure 2:
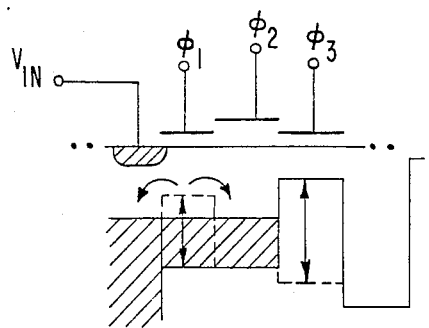
FIG. 2 illustrates the use of Tompsett injection as a technique for fat zero injection. Beneath the schematic circuit diagram is a potential diagram which illustrates the various surface potential levels in the corresponding regions of the circuit. The same conventions as for FIG. 1 apply also to FIG. 2.
Figure 3:
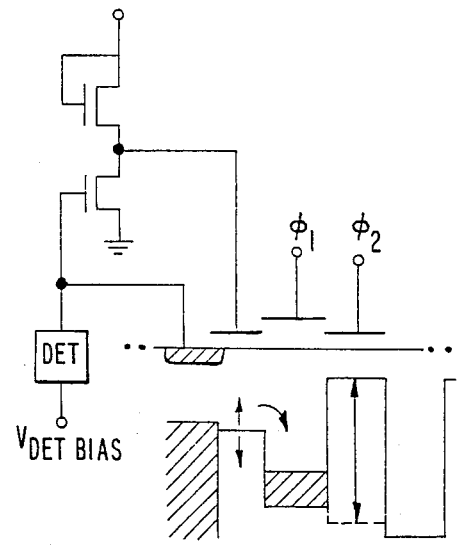
FIG. 3 illustrates the buffered direct injection method, also referred to as the synthetic transimpedance amplifier circuit method. Beneath the schematic circuit diagram is a potential diagram which illustrates the various surface potential levels in the corresponding regions of the circuit. The same conventions as for FIG. 1 apply also to FIG. 3.
Figure 4:
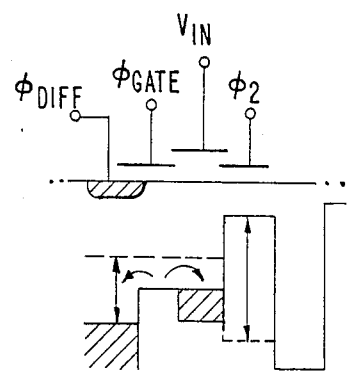
FIG. 4 illustrates the Tompsett sampler charge injection circuit. Beneath the schematic circuit diagram is a potential diagram which illustrates the various surface potential levels in the corresponding regions of the circuit. The same conventions as for FIG. 1 apply also to FIG. 4.
Figure 5:
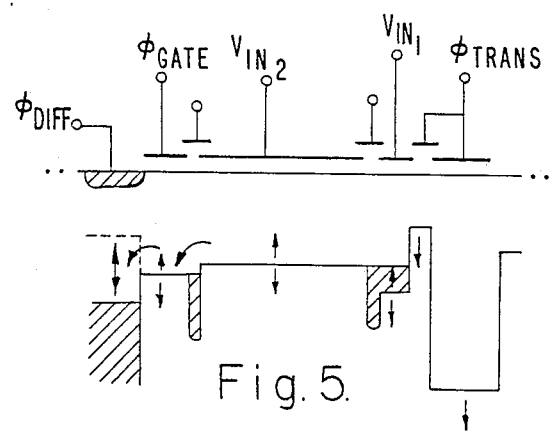
FIG. 5 shows an improved version of the Tompsett charge sampler circuit. Beneath the schematic circuit diagram is a potential diagram which illustrates the various surface potential levels in the corresponding regions of the circuit. The same conventions as for FIG. 1 apply also to FIG. 5.
Figure 6:
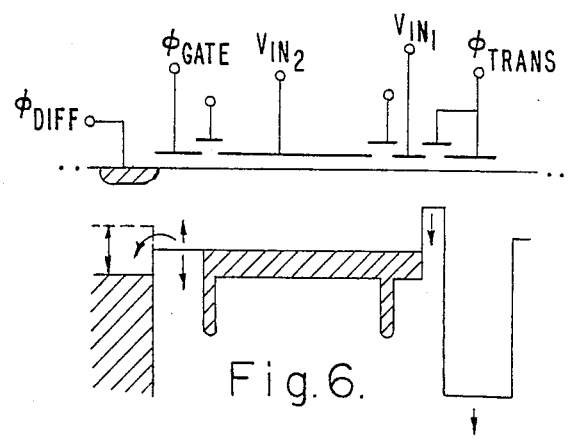
FIG. 6 shows the improved version of the Tompsett sampler charge injection circuit being used for testing requiring full dynamic range. Beneath the schematic circuit diagram is a potential diagram which illustrates the various surface potential levels in the corresponding regions of the circuit. The same conventions as for FIG. 1 apply also to FIG. 6.
Figure 7:
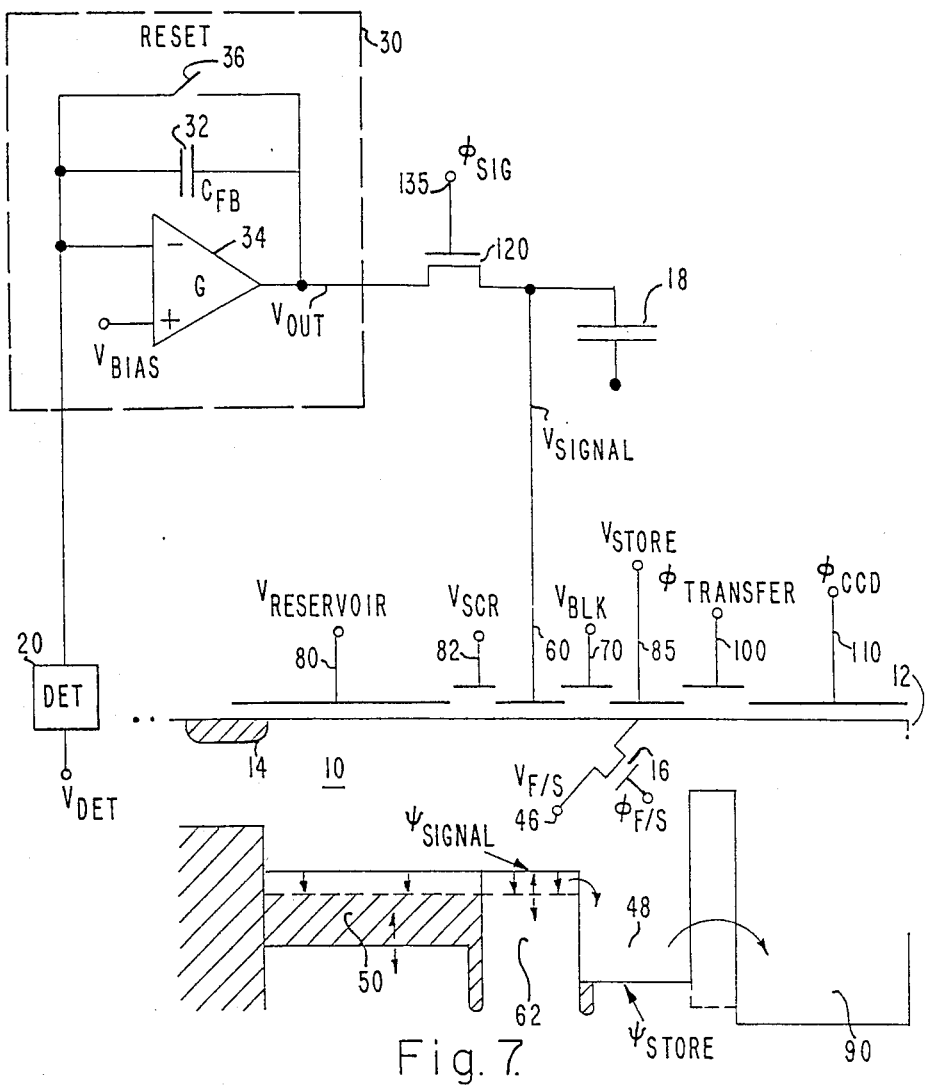
FIG. 7 comprises a schematic representation of a preferred embodidment of the subject invention. Beneath the schematic circuit diagram is a potential diagram which illustrates the various surface potential levels in the correspondidng regions of the circuit. The crosshatched areas represent charge, and a broken line represents a temporarily changed potential level. Vertical arrows indicate directions of change of a potential level, whereas curved arrows give the direction of flow of charge. Small opposed vertical arrows above and below the line representing a surface potential level indicate fluctuation of that surface potential due primarily to 1/f-type surface noise. The rightmost potential level in the drawing is for a CCD channel.

Referring to FIG. 7, the invention 10 includes a semiconducting substrate or "chip" 12 on which the various signal and control electrodes, channel stop 14, solid-state switching means 16, and capacitor 18 are formed. A typical photodetector might comprise a p-type collection area formed in the surface of an n-type semiconducting substrate. Each photodetector of an array generates charge carriers which are periodically collected as a single charge packet during an integration period.

Referring to FIG. 7, operation of a preferred embodiment of the present invention 10 may be described as follows. The photodetector element 20 is connected to a source of voltage bias. The capacitive feedback transimpedance amplifier circuit 30 is allowed to integrate signal current onto feedback capacitor 32 immediately following reset, using reset switching means 36. The gain of the operational amplifier 34 is made high enough so that the voltage across the photodetector 20 does not change substantially as the photodetector current is integrated on the feedback capacitor 32. When the subject invention is used for fat zero injection, alternate circuitry (not shown) is used to generate the needed change in voltage ΔV. Such circuitry is well known in the art and will not be described here.

Figure 8:
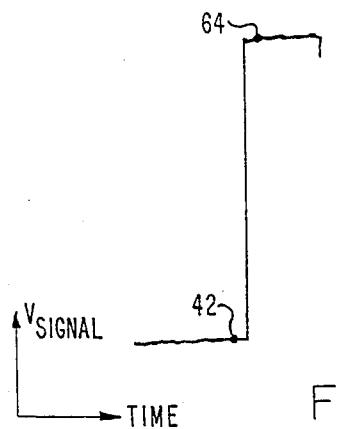
FIG. 8 is a plot of signal voltage versus time showing a portion of one cycle of a typical signal waveform.
Figure 9:
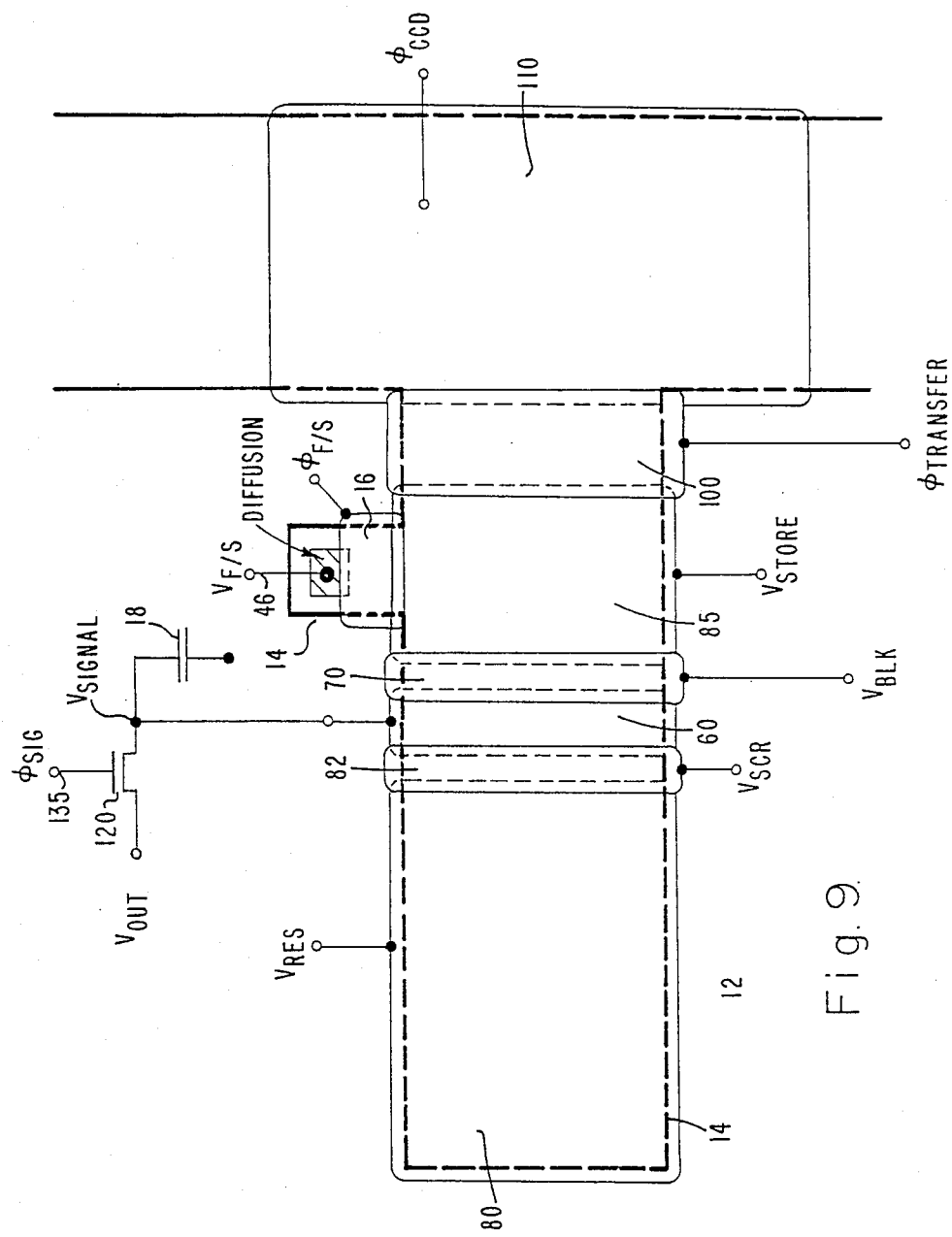
FIG. 9 is a top view of a preferred embodiment of the present invention.

A portion of one cycle of a typical waveform from the CTIA is shown in FIG. 8, with height representing signal voltage and horizontal distance along the waveform representing the passage of time. At the time on the waveform marked 42 the solid-state fill/spill switching means 16 (shown as an FET) is turned on and the voltage $V_{F/S}$ on terminal 46 is pulsed to fill the store well 48 with charge and then spill it. The reservoir well 50 is simultaneously filled to the $\psi_{SIGNAL}$ surface potential level. Soon thereafter $V_{SIGNAL}$ changes as shown in FIG. 8 and the resultant surface potential under signal gate electrode 60 drops proportionately and mobile charge is free to flow over the $\psi_{SIGNAL}$ potential barrier 62 into the store well 48. The flow of charge will stop when the reservoir 50 has emptied to the new level of $\psi_{SIGNAL}$. After the time marked 64 on the signal waveform shown in FIG. 8, further transfer of charge from reservoir 50 to store well 48 is prevented as follows. Either the $V_{SIGNAL}$ level is changed so that the $\psi_{SIGNAL}$ surface potential is raised, or the $\psi_{BLK}$ surface potential may be raised by applying a clock pulse to blocking gate electrode 70 so that $\psi_{BLK}$ is well above $\psi_{SIGNAL}$. By increasing the area of reservoir gate electrode 80, a larger charge packet per unit voltage change can be achieved. The screen gate electrode 82, which partially overlaps reservoir gate electrode 80 and signal gate electrode 60, controls the shape of the transition region between the reservoir potential well 50 and the signal potential barrier 62, through the electrical potential applied to it.

FIG. 10 shows the relative timing of the reset clock pulses applied to reset switching means 36, the $V_{OUT}$ pulses coming from the capacitive feedback transimpedance amplifier 30, the $\psi_{SIGNAL}$ pulses applied to terminal 135, the $V_{SIGNAL}$ pulses applied to signal gate electrode 60, the $V_{F/S}$ pulses applied to terminal 46, the $\phi_{F/S}$ pulses applied to the gate of solid-state switching means 16, and the $\psi_{TRANSFER}$ pulses applied to transfer gate electrode 100. At the bottom of FIG. 10 is also shown the charge pulses in the storage surface potential well 62 underneath store gate electrode 85.

The gates 60, 80, 85, and 110 are preferably formed in a first layer of polycrystalline semiconducting material on an insulating dielectric layer overlying the semiconducting substrate 12, in accordance with well known principles of fabrication of charge-coupled devices.

The gates 70, 82, and 100 overlie the gaps between the gate pairs 80, 60; 60, 85; and 85, 110. They partially overlap their respective gate pairs and are preferably formed in a second layer of polycrystalline semiconducting material.

The switching MOSFET 120 controlled by gate 135 allows disconnection of the output of the CTIA from the signal gate so that the instantaneous voltage $V_{OUT}$ will be held on the capacitance 18. The MOSFET gate 135 is rebiased to allow connection to the CTIA at the beginning of the integration cycle when the voltage $V_{OUT}$ is held on the capacitance 18, and at the end of the integration period when the fill/spill and signal charge transfer occur.

Although the present invention has been described in detail with reference to a particular preferred embodiment, persons possessing ordinary skill in the art to which this invention pertains will appreciate that various modifications may be made without departing from the spirit and scope of the invention.

What is claimed is:

1. A method of low-noise charge injection for use with a charge-coupled device in an imaging system, including the steps of:
    periodically integrating the current from a photodetector during a dwell time period of said photodetector with a photodetector amplifier circuit while maintaining a substantially constant bias on said photodetector;
    periodically filling a first potential well with a first amount of charge;
    periodically spilling a second amount of charge from said first potential well into a second potential well to form a charge packet which is pecisely proportional to said integrated current from said photodetector;
    periodically adding said precisely proportional charge packet from said second potential well to a preexisting charge in a charge-coupled device channel; and
    periodically resetting a first output level of said photodetector amplifier circuit to a second output level at the beginning of said photodetector dwell time period.

2. The method recited in claim 1 in which said charge spilling is effected by applying a signal voltage derived from an output voltage change from said photodetector amplifier circuit to lower a potential barrier between said first potential well and said second potential well so as to allow an amount of charge proportional to said output voltage to be transferred to said second potential well.

3. The method recited in claim 2 in which said charge spilling is effected by applying a signal voltage derived from an output voltage change produced by capacitive feedback transimpedance amplification of a photodetector signal.

4. The method recited in claim 2 in which said voltage applied in said charge spilling is produced by a conventional fat zero waveform generating circuit which replaces said photodetector current integration means, whereby a precisely proportional fat zero charge packet is generated and fat zero charge injection is accomplished.

5. Apparatus for a low-noise charge transfer device charge-injection circuit comprising:
   integration means for periodically integrating a current from a photodetector during a dwell time period of said photodetector while maintaining a substantially constant bias on said photodetector;
   means for periodically filling a first potential well with a first amount of charge;
   means for periodically spilling a second amount of charge from said first potential well into a second potential well to form a charge packet which is precisely proportional to said integrated photodetector current;
   means for periodically transferring said precisely proportional charge packet from said second potential well to a charge-coupled device channel;
   means for periodically resetting a first output level of said photodetector integration means to a second output level corresponding to the beginning of said photodetector dwell time period.

6. Apparatus as claimed in claim 5 in which said current integration means, said potential well filling means, said charge spilling means, said charge transferring means, and said resetting means are all formed on a semiconducting substrate.

7. Apparatus as claimed in claim 6 in which said photodetector is formed on said semiconducting substrate.

8. Apparatus as claimed in claim 5 in which said photodetector integration means is a capacitive transimpedance amplifier.

9. Apparatus as claimed in claim 6 in which said photodetector integration means is a capacitive transimpedance amplifier.

10. Apparatus as claimed in claim 7 in which said photodetector integration means is a capacitive transimpedance amplifier.

11. Apparatus as claimed in claim 6 which further comprises:
   a reservoir gate electrode on a first insulating dielectric layer overlying said semiconducting substrate;
   a surface-implant channel stop in said semiconducting substrate, adjacent and to one side of said reservoir gate electrode;
   means for applying an electrical potential to said reservoir gate to create a reservoir surface potential well beneath said reservoir gate electrode;
   a signal gate electrode on said first insulating dielectric layer overlying said semiconducting substrate, adjacent said reservoir gate electrode;
   a screen gate electrode on a second insulating dielectric layer overlying said first insulating dielectric layer overlying said semiconducting substrate, covering an area between and partially overlapping said reservoir gate electrode and said signal gate electrode;
   means for applying an electrical potential to said screen gate electrode to create a sharp boundary to a surface potential well underneath said reservoir gate electrode;
   a store gate electrode on said first insulating dielectric layer overlying said semiconducting substrate adjacent said signal gate electrode;
   a blocking gate electrode overlying said semiconducting substrate layer on said second insulating dielectric layer, covering an area between and partially overlapping said signal gate electrode and said store gate electrode;
   means for periodically applying an electrical potential to said blocking gate electrode so that a first surface potential underneath said blocking gate electrode is substantially higher than a second surface potential underneath said signal gate electrode;
   means for periodically applying an electrical potential to said store gate electrode for the purpose of establishing a storage surface potential well underneath said store gate electrode and insuring that said storage surface potential well is substantially deeper than said reservoir surface potential well underneath said reservoir gate electrode;
   first switching means for periodically resetting said first output level of said photodetector current integration means to said second output level of said photodetector current integration means;
   second switching means connecting the output of said photodetector current integration means with said signal gate electrode;
   a solid-state switching device formed on said semiconductive substrate for the purpose of filling/spilling said reservoir potential well;
   means for turning said solid-state switching device on or off to fill or spill said reservoir surface potential well underneath said reservoir gate electrode;
   capacitive charge storage means connected between said signal gate electrode and said semiconducting substrate;
   a CCD channel gate electrode on said first insulating dielectric layer overlying said semiconducting substrate;
   a transfer gate electrode on said second insulating dielectric layer overlying said first insulating dielectric layer overlying said semiconducting substrate, covering the area between and partially overlapping said store gate electrode and said CCD channel gate electrode;
   means for periodically applying an electrical potential pulse to said transfer gate electrode to transfer said precisely proportional charge packet in said storage potential well to said CCD channel.

12. Apparatus as claimed in claim 11 in which said photodetector current integration means is a capacitive feedback transimpedance amplifier.

13. Apparatus as claimed in claim 11 in which said photodetector current integration means is replaced by a conventional fat zero waveform generating circuit, whereby the output of said conventional fat zero waveform generating circuit is converted into a precisely proportional fat zero charge packet which is injected into said CCD channel.

14. Apparatus as claimed in claim 11 in which said first and second switching means and said solid-state switching device are all MOSFETs.

* * * * *